(12) United States Patent
Sutardja (10) Patent No.: US 9,337,772 B2
(45) Date of Patent: May 10, 2016

(54) IMPULSE-ASSISTED LC TANK OSCILLATOR (71) Applicant: Sehat Sutardja, Los Altos Hills, CA (US)

(72) Inventor: Sehat Sutardja, Los Altos Hills, CA (US)

(73) Assignee: MARVELL WORLD TRADE LTD., St. Michael (BB)

( * ) Notice: Subject to any disclaimer, the term of this patent is extended or adjusted under 35 U.S.C. 154(b) by 0 days.

(21) Appl. No.: 14/565,565

(22) Filed: Dec. 10, 2014

(65) Prior Publication Data
US 2015/0162873 A1 Jun. 11, 2015

Related U.S. Application Data (60) Provisional application No. 61/914,613, filed on Dec. 11, 2013.

(51) Int. Cl.
*H03K 3/282* (2006.01)
*H03B 5/12* (2006.01)
*H03B 5/06* (2006.01)

(52) U.S. Cl.
CPC ............... *H03B 5/1203* (2013.01); *H03B 5/06* (2013.01); *H03B 5/1218* (2013.01); *H03B 5/1228* (2013.01); *H03B 5/1243* (2013.01)

(58) Field of Classification Search
CPC ...... H03B 5/1203; H03B 5/1243; H03B 5/06; H03B 5/1218; H03B 5/1228
USPC ............ 331/116 R, 117 R, 117 FE, 167, 182, 331/185, 186
See application file for complete search history.

(56) References Cited

U.S. PATENT DOCUMENTS

| 6,002,617 A * | 12/1999 | Manning ................ G11C 5/145 327/538 |
| 2014/0132362 A1 * | 5/2014 | Hsiao ..................... H03B 5/364 331/109 |

* cited by examiner

*Primary Examiner* — Richard Tan (57) ABSTRACT

An impulse generation circuit for a voltage controlled oscillator includes a zero-crossing detector configured to detect a zero-crossing time of an output signal of the voltage controlled oscillator. The zero-crossing time corresponds to a time that the output signal crosses from a first polarity to a second polarity. A delay circuit is configured to wait for a delay period based on the zero-crossing time and a voltage peak of the output signal. An impulse generation module is configured to generate an impulse subsequent to the delay period. An energy injector is configured to, in response to the impulse, connect a supply voltage to the output signal of the voltage controlled oscillator for a duration of the impulse.

19 Claims, 5 Drawing Sheets

IMPULSE-ASSISTED LC TANK OSCILLATOR

CROSS-REFERENCE TO RELATED APPLICATIONS

This application claims the benefit of U.S. Provisional Application No. 61/914,613, filed on Dec. 11, 2013. The entire disclosure of the application referenced above are incorporated herein by reference.

FIELD

The present disclosure relates to a voltage controlled oscillator, and more particularly to a voltage controlled oscillator implementing an improved inductor/capacitor (LC) tank oscillator.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A voltage controlled oscillator (VCO) generates an output having an oscillation frequency that is based on a voltage input. The VCO is typically implemented using analog control and components. Various electronic devices, such as radio frequency transceivers, include VCOs.

Figure 1:
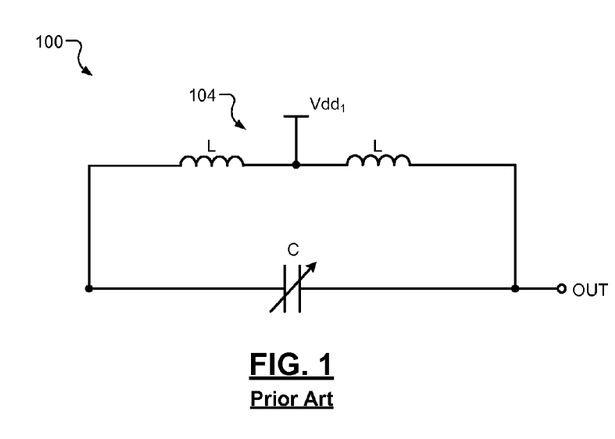
FIG. 1 is an example voltage controlled oscillator according to the prior art.

FIG. 1 shows an example VCO 100 including an inductor/capacitor (LC) tank circuit 104 that receives a supply voltage $Vdd_1$. The LC tank circuit 104 includes one or more inductors L connected in parallel with a tunable capacitor C. An oscillation frequency of an output of the LC tank circuit 104 is controlled by tuning the capacitor C.

SUMMARY

An impulse generation circuit for a voltage controlled oscillator includes a zero-crossing detector configured to detect a zero-crossing time of an output signal of the voltage controlled oscillator. The zero-crossing time corresponds to a time that the output signal crosses from a first polarity to a second polarity. A delay circuit is configured to wait for a delay period based on the zero-crossing time and a voltage peak of the output signal. An impulse generation module is configured to generate an impulse subsequent to the delay period. An energy injector is configured to, in response to the impulse, connect a supply voltage to the output signal of the voltage controlled oscillator for a duration of the impulse.

A system includes a voltage controlled oscillator configured to generate an output voltage. A first impulse generation circuit is connected to a first output voltage node of the voltage controlled oscillator. The first impulse generation circuit is configured to detect a first zero-crossing time of the output voltage at the first output voltage node, wherein the first zero-crossing time corresponds to a first time that the output voltage crosses from a first polarity to a second polarity, and selectively connect a supply voltage to the output voltage based on the first zero-crossing time and a first delay period. A second impulse generation circuit is connected to a second output voltage node of the voltage controlled oscillator. The second impulse generation circuit is configured to detect a second zero-crossing time of the output voltage at the second output voltage node, wherein the second zero-crossing time corresponds to a second time that the output voltage crosses from the first polarity to the second polarity, and selectively connect the supply voltage to the output voltage based on the second zero-crossing time and a second delay period.

An impulse generation method for a voltage controlled oscillator includes detecting a zero-crossing time of an output signal of the voltage controlled oscillator, wherein the zero-crossing time corresponds to a time that the output signal crosses from a first polarity to a second polarity, waiting for a delay period based on the zero-crossing time and a voltage peak of the output signal, generating an impulse subsequent to the delay period, and, in response to the impulse, connecting a supply voltage to the output signal of the voltage controlled oscillator for a duration of the impulse.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Voltage controlled oscillators (VCOs) are typically controlled in an analog manner. For example, during operation, a supply voltage is provided to an inductor/capacitor (LC) tank circuit of the VCO, causing energy to be stored in the LC tank circuit. At a resonant frequency, the energy varies between voltage energy stored in a capacitor of the LC tank circuit and current energy flowing through one or more inductors of the LC tank circuit. However, losses are associated with real-world implementation of the LC tank circuit, which may dampen the oscillation frequency of an output signal of the VCO.

A VCO according to the principles of the present disclosure implements one or more impulse generation circuits configured to provide digital feedback, and therefore digital control, of the output signal of the VCO. The impulse generation circuit determines timing of voltage peaks of the output signal and generates a digital pulse, or impulse, that causes a corresponding pulse of energy to be injected into the output signal. For example, the impulse generation circuit detects a zero-crossing of the output signal and estimates timing of a peak (e.g., a positive or negative peak) of the output signal. Subsequent to a predetermined (calibrated) or calculated delay (e.g., based on an estimated period between the zero-crossing and the peak), the impulse generation circuit generates the impulse. The impulse turns on a switch (e.g., a transistor) for a duration of the impulse, providing additional energy (e.g., a voltage) to the LC tank circuit.

Figure 2:
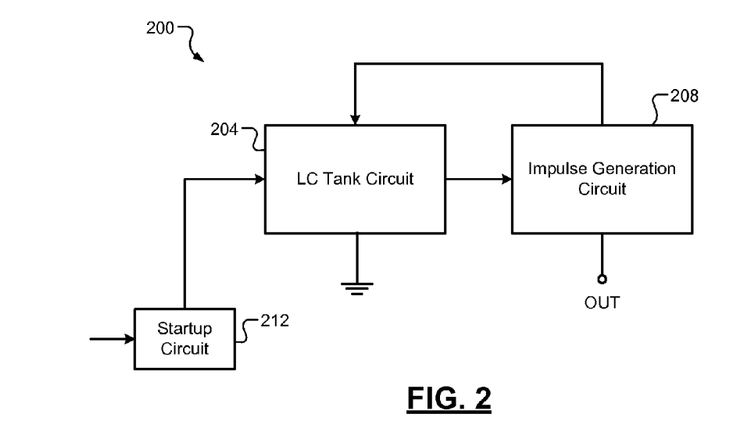
FIG. 2 is an example voltage controlled oscillator including an impulse generation circuit according to the principles of the present disclosure.

FIG. 2 shows an example VCO 200 including an LC tank circuit 204 and an impulse generation circuit 208 according to the principles of the present disclosure. Embodiments may also include a startup circuit 212.

The impulse generation circuit 208 is in communication with an output of the LC tank circuit 204, which corresponds to an output signal (OUT) of the VCO 200, and detects a zero-crossing of the output signal. Upon detecting the zero-crossing of the output signal, the impulse generation circuit 208 waits a predetermined or calculated delay and generates an impulse. The delay corresponds to a time immediately subsequent to a voltage peak (e.g., a negative voltage peak) of the output signal of the VCO 200. For example only, the impulse turns on a switch (e.g., a transistor, as shown in further detail in FIG. 3), which provides a supply voltage to the LC tank circuit 204. The supply voltage provided by the impulse generation circuit 208 pulls up the voltage of the output signal. Accordingly, the impulse causes energy (via the supply voltage) to be provided from the impulse generation circuit 208 back to the LC tank circuit 204, optimizing the output signal of the VCO 200.

The optional startup circuit 212 may be enabled during startup (e.g., during power up) of the VCO 200. The startup circuit 212 provides a voltage (e.g., a supply voltage having an opposite polarity of the supply voltage of the impulse generation circuit 208) to optimize efficiency of the VCO 200 during startup.

Figure 3:
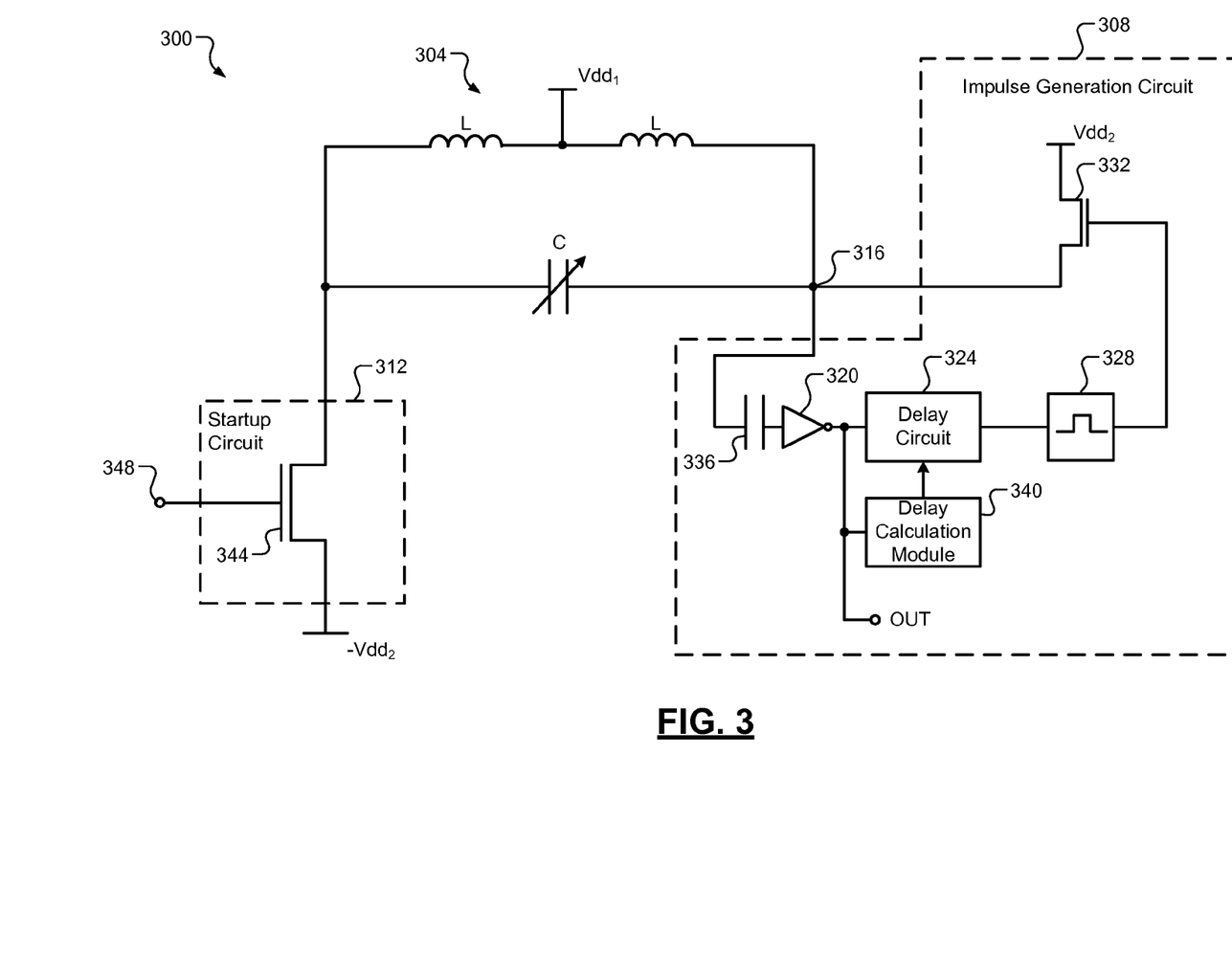
FIG. 3 is an example voltage controlled oscillator including an impulse generation circuit shown in more detail according to the principles of the present disclosure.

FIG. 3 shows an example VCO 300 in more detail. The VCO 300 includes an LC tank circuit 304, an impulse generation circuit 308, and a startup circuit 312. The LC tank circuit 304 includes inductors L and a capacitor C connected in parallel. The LC tank circuit 304 receives a supply voltage $Vdd_1$ and generates an oscillating output voltage 316 corresponding to an output signal (OUT) of the VCO 300. The capacitor C may have a tunable (i.e., adjustable) capacitance as indicated in FIG. 3. A capacitance of the capacitor C is adjusted to adjust the oscillating frequency of the output voltage 316.

The impulse generation circuit 308 includes an inverter 320, a delay circuit 324, an impulse generation module 328, and a switch (e.g., a transistor) 332. The impulse generation circuit 308 may include an optional coupling capacitor 336 in a self-biased or externally biased arrangement to filter any DC signals received from the LC tank circuit 304.

The inverter 320 operates as a zero-crossing detector to detect a zero-crossing of the output voltage 316 (i.e., a crossing of the output voltage 316 from a first polarity, such as a positive voltage, to a second polarity, such as a negative voltage) of the LC tank circuit 304. An output of the inverter 320 indicates the zero-crossing of the output voltage 316. As described in FIG. 3, the inverter 320 may provide the output indicating the zero-crossing only when the output voltage 316 crosses from a positive voltage to a negative voltage. Although described as the inverter 320, other suitable structure may be used to indicate the zero-crossing of the output voltage 316.

The delay circuit 324 receives the output of the inverter 320 and, subsequent to a predetermined or calculated delay, triggers the impulse generation module 328. For example, an output of the delay circuit 324 may change from a first state to a second state in response to the output of the inverter 320 indicating the zero-crossing and subsequent to the delay. In embodiments, the delay circuit 324 is a digital circuit. For example only, the first state corresponds to a first binary value (e.g., 0) and the second state corresponds to a second binary value (e.g., 1).

The delay corresponds to a predetermined or calculated period based on the zero-crossing (from positive to negative) of the output voltage 316 and a peak (as described, a negative voltage peak) of the output voltage 316. In particular, the delay corresponds to a period between the zero-crossing and a time immediately subsequent to the negative peak of the output voltage. For example only, the time immediately subsequent to the negative peak of the output voltage 316 corresponds to less than or equal to approximately ⅛, ​1/16, or ​1/32 of a period of the output voltage 316. It should be understood that, for purposes of determining the delay, the peak of the output voltage 316 does not necessarily have to be an absolute maximum or minimum of the output voltage 316; the peak can be a value within a range that is in proximity of such maximum or minimum.

In embodiments, the impulse generation circuit 308 may include a delay calculation module 340. The delay calculation module 340 receives the output signal OUT of the VCO 300 and calculates the delay accordingly. For example, the delay calculation module 340 monitors the output signal OUT to determine the zero-crossing and the negative peak of the output signal OUT and measures a time between the zero-crossing and the negative peak. The delay calculation module 340 calculates the delay based on the time between the zero-crossing and the negative peak. For example only, the delay may be calculated according to $Td=Tp+\Delta$, where Td corresponds to the delay, Tp corresponds to the time between the zero-crossing and the negative peak, and $\Delta$ corresponds to the time between the negative peak and the time immediately subsequent to the negative peak.

The impulse generation module 328 generates an impulse (e.g., a single pulse) in response to the trigger received from the delay circuit 324. For example only, the impulse generation module 328 is implemented as digital circuit. The impulse is received by the transistor 332, which operates as an energy injector. Specifically, the transistor 332 turns on in response to the impulse and for a duration of the impulse, thereby providing a supply voltage $Vdd_2$ to the LC tank circuit 304. The resulting "pulse" of energy is injected at the time immediately subsequent to the negative peak of the output voltage 316. Accordingly, the pulse functions to pull up the output voltage 316 as the output voltage 316 begins to increase from the negative voltage peak and return to the zero-crossing.

The startup circuit 312 includes a transistor 344. The transistor 344 receives a startup signal 348 indicating when the VCO 300 is an a startup mode. The transistor 344 is turned on in response to the startup signal 348. Accordingly, the startup circuit 312 provides a supply voltage (e.g., a voltage complementary to the supply voltage $Vdd_2$, or $-Vdd_2$) to the LC tank circuit 304 to optimize startup of the VCO 300.

Figure 4:
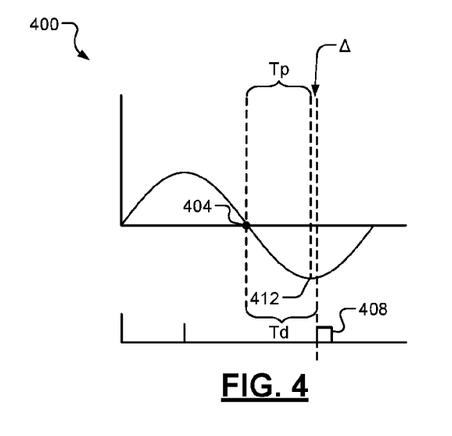
FIG. 4 illustrates an example delay for generating an impulse according to the principles of the present disclosure.

FIG. 4 shows an output voltage 400 and an example Td, Tp, and $\Delta$ according to the principles of the present disclosure. With further reference to FIG. 3, the inverter 320 detects a zero-crossing 404 of the voltage 400. The delay circuit 324 generates an impulse 408 subsequent to the delay time Td, which corresponds to Tp (a time between the zero-crossing 404 and a negative peak 412)+$\Delta$.

Figure 5:
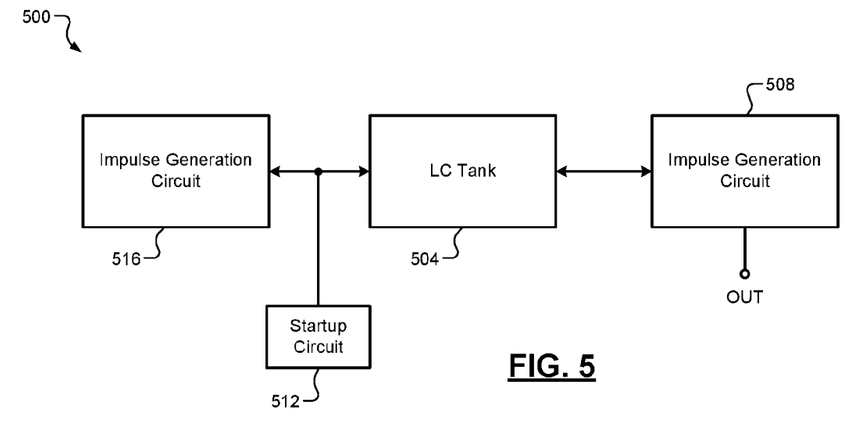
FIG. 5. is an example voltage controlled oscillator including an impulse generation circuit and a complementary impulse generation circuit according to the principles of the present disclosure.

FIG. 5 shows an example VCO 500 including an LC tank circuit 504, an impulse generation circuit 508, a startup circuit 512, and an impulse generation circuit 516. The LC tank circuit 504, the impulse generation circuit 508, and the startup circuit 512 operate in a manner analogous to the LC tank circuit 304, the impulse generation circuit 308, and the startup circuit 312 as described in FIG. 3. However, the impulse generation circuit 516 operates in a similar but complementary manner to the impulse generation circuit 508.

For example, the impulse generation circuit 516 also detects a zero-crossing of the output signal of the VCO 500. Upon detecting the zero-crossing of the output signal, the impulse generation circuit 516 waits a predetermined or calculated delay and generates an impulse. However, the impulse generation circuit 516 monitors the output signal at a different output node than the impulse generation circuit 508. Accordingly, the impulse generation circuit 516 generates the impulse subsequent to a positive peak that is out of phase (e.g., by 180 degrees) with respect to the positive peak monitored by the impulse generation circuit 508. In other words, the positive peak of the output signal as received by the impulse generation circuit 516 corresponds to a negative peak of the output signal as received by the impulse generation circuit 508. The impulse generated by the impulse generation circuit 316 turns on a transistor that provides the supply voltage $Vdd_2$ to the LC tank circuit 504.

Accordingly, the supply voltage provided (and corresponding energy injected) by the impulse generation circuit 316 is complementary to the supply voltage provided by the impulse generation circuit 308. In this manner, the impulse generation circuit 508 provides a positive voltage "push" (i.e., by pulling up the output voltage) to the output signal of the VCO 500 immediately subsequent to a negative peak as seen at a first output voltage node, while the impulse generation circuit 516 provides a positive voltage "push" to the output signal of the VCO 500 immediately subsequent to a negative peak as seen at a second output voltage node 180 degrees out of phase with the first output voltage node.

Figure 6:
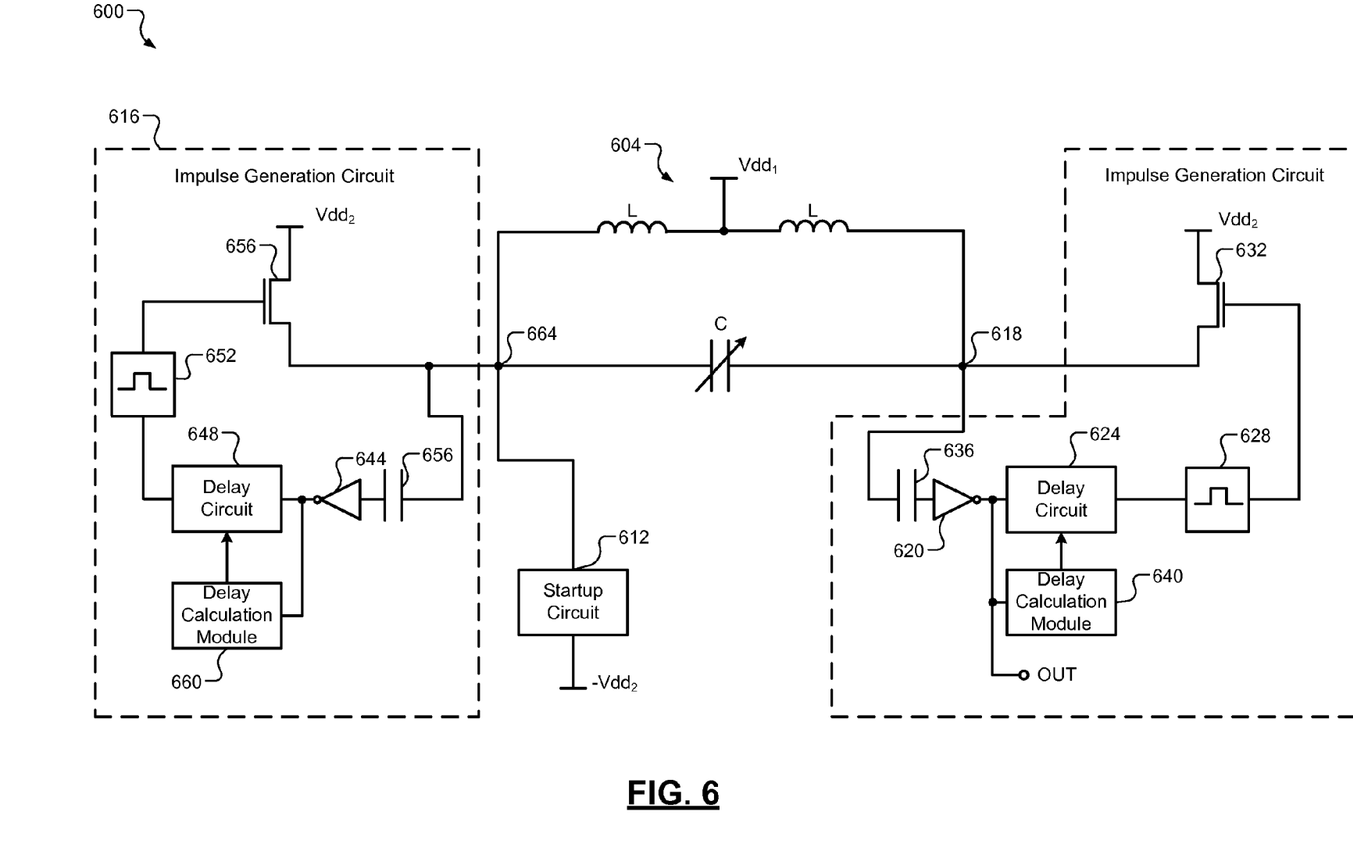
FIG. 6 is an example voltage controlled oscillator including an impulse generation circuit and a complementary impulse generation circuit shown in more detail according to the principles of the present disclosure.

FIG. 6 shows an example VCO 600, corresponding to the VCO 500 shown in FIG. 5, in more detail. The VCO 600 includes an LC tank circuit 604, an impulse generation circuit 608, a startup circuit 612, and an impulse generation circuit 616. The LC tank circuit 604 receives a supply voltage $Vdd_1$ and generates an oscillating output voltage at a first output voltage node 618 corresponding to an output signal (OUT) of the VCO 600. The startup circuit 612 operates similarly to the startup circuit 312 as described in FIG. 3.

The impulse generation circuit 608 includes an inverter 620, a delay circuit 624, an impulse generation module 628, and a transistor 632. The impulse generation circuit 308 may include an optional coupling capacitor 636 and a delay calculation module 640 that operate similarly to the coupling capacitor 336 and the delay calculation module 340 as described in FIG. 3.

The inverter 620 operates as a zero-crossing detector to detect a zero-crossing of the output voltage at the first output voltage node 618 of the LC tank circuit 604. The inverter 620 may provide the output indicating the zero-crossing only when the output voltage at the first output voltage node 618 crosses from a positive voltage to a negative voltage.

The delay circuit 624 receives the output of the inverter 620 and, subsequent to a predetermined or calculated delay, triggers the impulse generation module 628. For example, an output of the delay circuit 624 may change from a first state to a second state in response to the output of the inverter 620 indicating the zero-crossing and subsequent to the delay. The delay corresponds to a predetermined or calculated period based on the zero-crossing (from positive to negative) of the output voltage at the first output voltage node 618 and a peak (as described, a negative voltage peak) of the output voltage. The delay corresponds to a period between the zero-crossing and a time immediately subsequent to the negative peak of the output voltage. The time immediately subsequent to the negative peak of the output voltage may correspond to, for example only, less than or equal to approximately $\frac{1}{8}$, $\frac{1}{16}$, or $\frac{1}{32}$ of a period of the output voltage at the first output voltage node 618.

The impulse generation module 628 generates an impulse (e.g., a single pulse) in response to the trigger received from the delay circuit 624. The impulse is received by the transistor 632. The transistor 632 turns on in response to the impulse and for a duration of the impulse, thereby providing a supply voltage $Vdd_2$ to the LC tank circuit 604. The resulting "pulse" of energy is injected at the time immediately subsequent to the negative peak of the output voltage 618. Accordingly, the pulse pulls up the output voltage 618 as the output voltage 618 begins to increase from the negative voltage peak and return to the zero-crossing.

The impulse generation circuit 616 includes an inverter 644, a delay circuit 648, an impulse generation module 652, and a transistor 656. The impulse generation circuit 616 may include an optional coupling capacitor 656 and a delay calculation module 660 that operate similarly to the coupling capacitor 336 and the delay calculation module 340 as described in FIG. 3. The impulse generation circuit 616 is connected to a second output voltage node 664 of the VCO 600 that is 180 degrees out of phase with the first output voltage node 618. In embodiments, a single delay calculation module may be connected to both the first output voltage node 618 and the second output voltage node 664 and calculate and provide respective delays to the delay circuits 624 and 648.

The inverter 644 operates as a zero-crossing detector to detect a zero-crossing of the output voltage at the second output voltage node 664 of the LC tank circuit 604. The inverter 644 may provide the output indicating the zero-crossing only when the output voltage at the second output voltage node 664 crosses from a positive voltage to a negative voltage.

The delay circuit 648 receives the output of the inverter 644 and, subsequent to a predetermined or calculated delay, triggers the impulse generation module 652. For example, an output of the delay circuit 648 may change from a first state to a second state in response to the output of the inverter 644 indicating the zero-crossing and subsequent to the delay. The delay corresponds to a predetermined or calculated period based on the zero-crossing (from positive to negative) of the output voltage at the second output voltage node 664 and a negative peak of the output voltage. The delay corresponds to a period between the zero-crossing and a time immediately subsequent to the negative peak of the output voltage. The time immediately subsequent to the negative peak of the output voltage at the second output voltage node 664 may correspond to, for example only, less than or equal to approximately $\frac{1}{8}$, $\frac{1}{16}$, or $\frac{1}{32}$ of a period of the output voltage at the second output voltage node 664.

The impulse generation module 652 generates an impulse (e.g., a single pulse) in response to the trigger received from the delay circuit 648. The impulse is received by the transistor 656. The transistor 656 turns on in response to the impulse and for a duration of the impulse, thereby providing the supply voltage $Vdd_2$ to the LC tank circuit 604. The resulting "pulse" of energy is injected at the time immediately subsequent to the negative peak of the output voltage at the second output voltage node 664. Accordingly, the pulse pulls up the output voltage at the second output voltage node 664 as the output voltage begins to increase from the negative voltage peak and return to the zero-crossing.

In this manner, the impulse generation circuits 608 and 616 respectively provide a positive voltage "push" to (i.e., by pulling up) the output signal of the VCO 600 immediately subsequent to negative peaks of the output voltage at the first output voltage node 618 and the second output voltage node 664, respectively.

Figure 7:
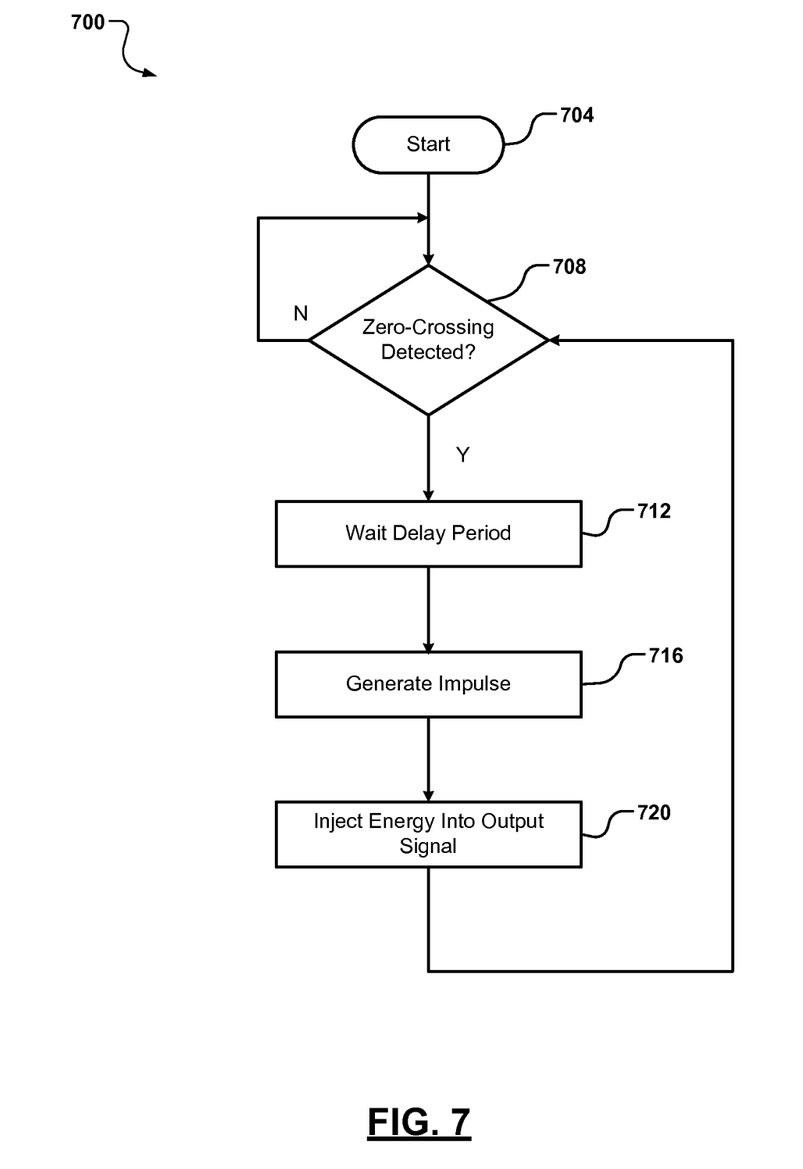
FIG. 7 is an example method for controlling a voltage controlled oscillator according to the principles of the present disclosure.

FIG. 7 shows an example method 700, beginning at 704, for controlling a voltage controlled oscillator according to the principles of the present disclosure. At 708, the method 700 determines whether a zero-crossing of an output voltage of the voltage controlled oscillator is detected. For example, a zero-crossing detector, such as an inverter, detects the zero-crossing and a delay circuit determines whether the zero-crossing corresponds to a cross from a positive voltage to a negative voltage. If true, the method 700 continues to 712. If false, the method 700 continues to 708.

At 712, the method 700 waits for a delay period subsequent to detecting the zero-crossing. For example, the delay circuit may include a timer or delay element (e.g., a buffer or other passive element) that implements the delay. At 716, the method 700 generates an impulse. For example, the delay circuit may trigger an impulse generation module that generates the impulse. At 720, the method 700 injects energy into an output signal of the voltage controlled oscillator for a duration of the impulse. For example, the impulse may turn on a transistor for the duration, causing a supply voltage to pull up the output signal of the voltage controlled oscillator. The method 700 then returns to 708.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. An impulse generation circuit for a voltage controlled oscillator, the impulse generation circuit comprising:
   a zero-crossing detector configured to detect a zero-crossing time of an output signal of the voltage controlled oscillator, wherein the zero-crossing time corresponds to a time that the output signal crosses from a first polarity to a second polarity;
   a delay circuit configured to wait for a delay period based on the zero-crossing time and a voltage peak of the output signal;
   an impulse generation module configured to generate an impulse subsequent to the delay period; and
   an energy injector configured to, in response to the impulse, connect a supply voltage to the output signal of the voltage controlled oscillator for a duration of the impulse.

2. The impulse generation circuit of claim 1, wherein the delay period is based on a period between the zero-crossing time and the voltage peak of the output signal.

3. The impulse generation circuit of claim 1, wherein the delay period is based on a period between the zero-crossing time and a time subsequent to the voltage peak of the output signal.

4. The impulse generation circuit of claim 3, wherein the time subsequent to the voltage peak is less than $\frac{1}{8}$, $\frac{1}{16}$, or $\frac{1}{32}$ of an oscillation period of the output signal subsequent to the voltage peak.

5. The impulse generation circuit of claim 1, wherein at least one of the delay circuit and the impulse generation module implements a digital circuit.

6. The impulse generation circuit of claim 1, wherein the impulse is a digital pulse.

7. The impulse generation circuit of claim 1, wherein the energy injector includes a transistor that is configured to be turned on in response to the impulse.

8. The impulse generation circuit of claim 1, wherein the zero-crossing detector includes an inverter.

9. A system comprising the impulse generation circuit of claim 1, and further comprising:
   a second impulse generation circuit configured to
      detect a second zero-crossing time of a second output signal, wherein the second zero-crossing time corresponds to a second time that the second output signal crosses from the first polarity to the second polarity,
      wait for a second delay period based on the second zero-crossing time and a second voltage peak of the second output signal,
      generate a second impulse subsequent to the second delay period, and
      in response to the second impulse, connect the supply voltage to the second output signal of the voltage controlled oscillator for a duration of the second impulse.

10. A system, comprising:
   a voltage controlled oscillator configured to generate a first output voltage;
   a first impulse generation circuit connected to a first output voltage node of the voltage controlled oscillator, the first impulse generation circuit configured to (i) detect a first zero-crossing time of the first output voltage at the first output voltage node, wherein the first zero-crossing time corresponds to a first time that the first output voltage crosses from a first polarity to a second polarity, and (ii) selectively connect a supply voltage to the first output voltage based on the first zero-crossing time and a first delay period, wherein the first delay period is based on the first zero-crossing time and a first voltage peak of the first output voltage; and
   a second impulse generation circuit connected to a second output voltage node of the voltage controlled oscillator, the second impulse generation circuit configured to (i) detect a second zero-crossing time of a second output voltage at the second output voltage node, wherein the second zero-crossing time corresponds to a second time that the second output voltage crosses from the first polarity to the second polarity, and (ii) selectively connect the supply voltage to the second output voltage based on the second zero-crossing time and a second delay period, wherein the second delay period is based on the second zero-crossing time and a second voltage peak of the second output voltage.

11. An impulse generation method for a voltage controlled oscillator, the method comprising:
   detecting a zero-crossing time of an output signal of the voltage controlled oscillator, wherein the zero-crossing time corresponds to a time that the output signal crosses from a first polarity to a second polarity;
   waiting for a delay period based on the zero-crossing time and a voltage peak of the output signal;
   generating an impulse subsequent to the delay period; and
   in response to the impulse, connecting a supply voltage to the output signal of the voltage controlled oscillator for a duration of the impulse.

12. The method of claim 11, wherein the delay period is based on a period between the zero-crossing time and the voltage peak of the output signal.

13. The method of claim 11, wherein the delay period is based on a period between the zero-crossing time and a time subsequent to the voltage peak of the output signal.

14. The method of claim 13, wherein the time subsequent to the voltage peak is less than $\frac{1}{8}$, $\frac{1}{16}$, or $\frac{1}{32}$ of an oscillation period of the output signal subsequent to the voltage peak.

15. The method of claim 11, wherein at least one of the waiting for the delay period and generating the impulse includes using a digital circuit.

16. The method of claim 11, wherein the impulse is a digital pulse.

17. The method of claim 11, wherein connecting the supply voltage to the output signal of the voltage controlled oscillator for the duration of the impulse includes using a transistor that is configured to be turned on in response to the impulse.

18. The method of claim 11, wherein detecting the zero-crossing time includes using an inverter to detect the zero-crossing time.

19. The method of claim 11, further comprising:
   detecting a second zero-crossing time of a second output signal, wherein the second zero-crossing time corresponds to a second time that the second output signal crosses from the first polarity to the second polarity;
   waiting for a second delay period based on the second zero-crossing time and a second voltage peak of the second output signal;
   generating a second impulse subsequent to the second delay period; and
   in response to the second impulse, connecting the supply voltage to the second output signal of the voltage controlled oscillator for a duration of the second impulse.

* * * * *